United States Patent
Boyanov et al.

(10) Patent No.: US 7,544,896 B2
(45) Date of Patent: *Jun. 9, 2009

(54) FORMING A POROUS DIELECTRIC LAYER AND STRUCTURES FORMED THEREBY

(75) Inventors: Boyan Boyanov, Portland, OR (US); Grant M. Kloster, Lake Oswego, OR (US); Vijay Ramachandrarao, Hillsboro, OR (US); Hyun-Mog Park, Portland, OR (US)

(73) Assignee: Intel Corporation, Santa Clara, CA (US)

(*) Notice: Subject to any disclaimer, the term of this patent is extended or adjusted under 35 U.S.C. 154(b) by 110 days.

This patent is subject to a terminal disclaimer.

(21) Appl. No.: 11/367,180

(22) Filed: Mar. 3, 2006

(65) Prior Publication Data
US 2006/0145305 A1    Jul. 6, 2006

Related U.S. Application Data

(62) Division of application No. 11/027,104, filed on Dec. 30, 2004, now Pat. No. 7,179,755.

(51) Int. Cl.
*H01L 23/58* (2006.01)

(52) U.S. Cl. .................. 174/137 B; 257/E21.581; 257/499

(58) Field of Classification Search .............. None
See application file for complete search history.

(56) References Cited

U.S. PATENT DOCUMENTS

| | | |
|---|---|---|
| 5,976,284 A | 11/1999 | Calvert et al. |
| 2002/0139387 A1 | 10/2002 | Yates |
| 2003/0004218 A1 | 1/2003 | Allen et al. |
| 2003/0008129 A1 | 1/2003 | Cotte et al. |
| 2003/0198742 A1 | 10/2003 | Vrtis et al. |

OTHER PUBLICATIONS

Pending U.S. Appl. No. 11/096,678, filed Mar. 31, 2005, Inventor: Kloster et al.

*Primary Examiner*—Evan Pert
*Assistant Examiner*—Ben P Sandvik
(74) *Attorney, Agent, or Firm*—Kathy J. Ortiz

(57) ABSTRACT

Methods of forming a microelectronic structure are described. Embodiments of those methods include forming a dielectric layer utilizing a plasma, wherein the plasma comprises a porogen and substantially no oxidizing agent, and then applying energy to the dielectric layer, wherein the porogen disposed within the dielectric layer decomposes to form at least one pore.

7 Claims, 6 Drawing Sheets

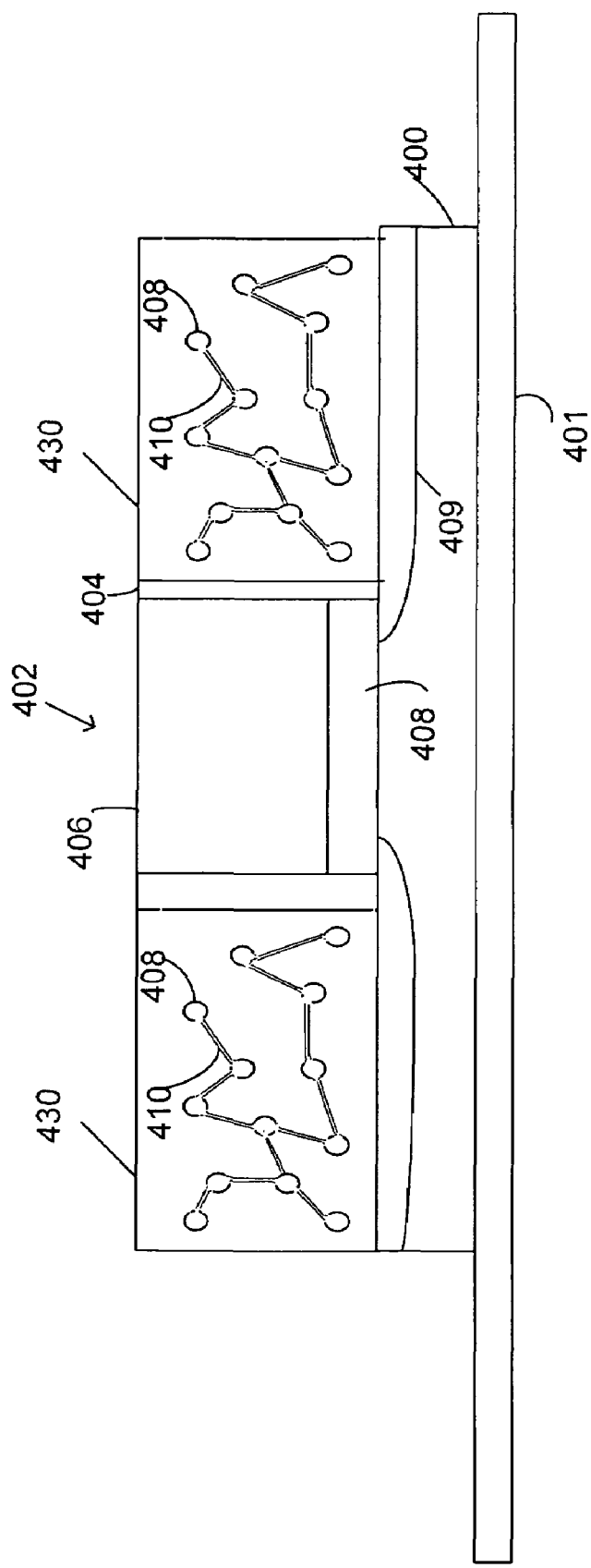

FORMING A POROUS DIELECTRIC LAYER AND STRUCTURES FORMED THEREBY

This U.S. Patent application is a divisional of U.S. patent application Ser. No. 11/027,104 filed Dec. 30, 2004 now U.S. Pat. No. 7,179,755.

BACKGROUND OF THE INVENTION

As microelectronic device sizes continue to shrink, there is a continued demand for low k interlayer dielectric (ILD) materials. Certain low k materials have been proposed, including various carbon-containing materials such as organic polymers and carbon-doped oxides. Such low dielectric constant materials may serve to reduce the resistance-capacitance (RC) delay of a microelectronic device and thus may contribute to improved device performance.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

FIG. 4a-4b represents a system according to an embodiment of the present invention.

DETAILED DESCRIPTION OF THE PRESENT INVENTION

Figure 1A:
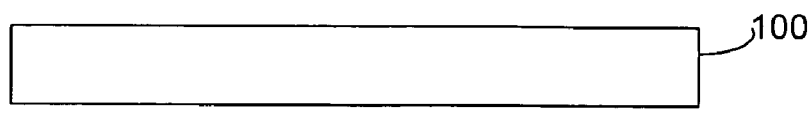
FIGS. 1a-1d represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a porous dielectric layer, are described. Those methods may comprise forming a dielectric layer utilizing a plasma, wherein the plasma comprises a porogen and substantially no oxidizing agent, and then applying energy to the dielectric layer, wherein the porogen disposed within the dielectric layer decomposes to form at least one pore.

FIGS. 1a-1d illustrate an embodiment of a method of forming a microelectronic structure, such as a porous dielectric layer, for example. FIG. 1a illustrates a substrate 100. The substrate 100 may comprise any surface that may be generated when making a microelectronic device, upon which an insulating layer may be formed. The substrate 100 may include, for example, active and passive devices that are formed on a silicon wafer such as transistors, capacitors, resistors, diffused junctions, gate electrodes, local interconnects, etc. The substrate 100 may also include insulating materials (e.g., silicon dioxide, either undoped or doped with phosphorus (PSG) or boron and phosphorus (BPSG), silicon nitride, silicon oxynitride, silicon carbide, carbon doped oxide, or a polymer) that separate such active and passive devices from conductive layers that are formed on top of them, and may include various types of conductive layers, for example.

Figure 1B:
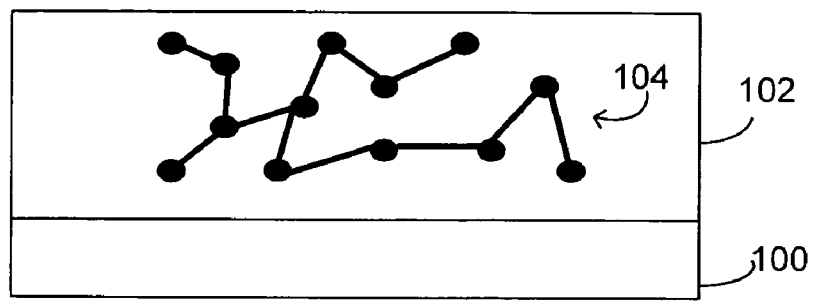

A dielectric layer 102 may be formed on the substrate 100 (FIG. 1b). In one embodiment, the dielectric layer 102 may be formed utilizing a plasma, during a plasma deposition process for example, wherein the plasma may comprise a porogen 104, as is well known in the art. In one embodiment, the porogen 104 may comprise at least one of poly propylene glycol, methyl methacrylate, poly epsilon caprolactone, and poly ethylene oxide-b-propylene oxide-b-ethylene oxide. The porogen 104 may in general comprise any such material that may be exposed to an energy (subsequent to incorporation and/or polymerization within the formed dielectric layer 102) that may decompose and/or vaporize the porogen 104. The decomposition and/or vaporization of the porogen 104 may thus leaving a void, or a pore within the dielectric layer 102 where the porogen 104 previously occupied space, as is well known in the art.

In one embodiment, the plasma may also comprise a precursor that may form a dielectric layer, such as the dielectric layer 102. In one embodiment, the precursor may comprise any organo-silane compound that may exhibit low etch rates in fluorinated etchant chemistries. The precursor may comprise in some embodiments a carbon to silicon ratio that is greater than about 2:1. In one embodiment the precursor may comprise an enhanced availability of terminal methyl groups, such as, for example, terminal methyl groups bonded to a silicon atom (Si—$CH_3$), and may comprise oxidizing groups incorporated within the organo-silane compound. In one embodiment, the precursor may comprise at least one of octamethyl-cyclotetrasiloxane and cyclo-pentamethylene-methyl-methoxy-silane.

In one embodiment, the plasma may comprise little to no oxidizing agents. Oxidizing agents, such as oxygen, nitrous oxide, carbon dioxide and isopropal alcohol (IPA) may in some embodiments strip terminal methyl groups from dielectric layers formed with plasmas utilizing such oxidizing agents, which may reduce the hydrophobicity, and thus may increase the wetting of such dielectric layers during subsequent processing. Additionally, plasmas comprising oxidizing agents may also decrease the carbon content of dielectric layers so formed, and may further increase the silicon dioxide content of such dielectric layers.

By substantially removing oxidizing agents from the plasma, the dielectric layer 102 may exhibit a greatly reduced wetting by various etchants that may be used during subsequent processing, such as during wet cleaning and/or etching processes, for example. Reduction of the wetting of the dielectric layer 102 by such etchants may greatly reduce the susceptibility of the dielectric layer 102 to etchant attack from various halogens commonly used to remove dielectric layers, such as fluorine etchants, for example. In one embodiment, the plasma may contain a flow of less than 50 sccm of an oxidizing agent. In another embodiment, the plasma may contain a flow of substantially zero oxidizing agent.

In one embodiment, the plasma may comprise a pressure of about 1-10 mTorr, a temperature of about 2-400 degrees Celsius, and a power of about 100 Watts to about 400 Kilowatts. In another embodiment, the plasma may comprise a precurser flow rate from about 1 g/L to about 10 g/L, a porogen flow rate of about 1 to about 10 g/L and an oxidizer flow rate of less than about 50 sccm.

Figure 1C:
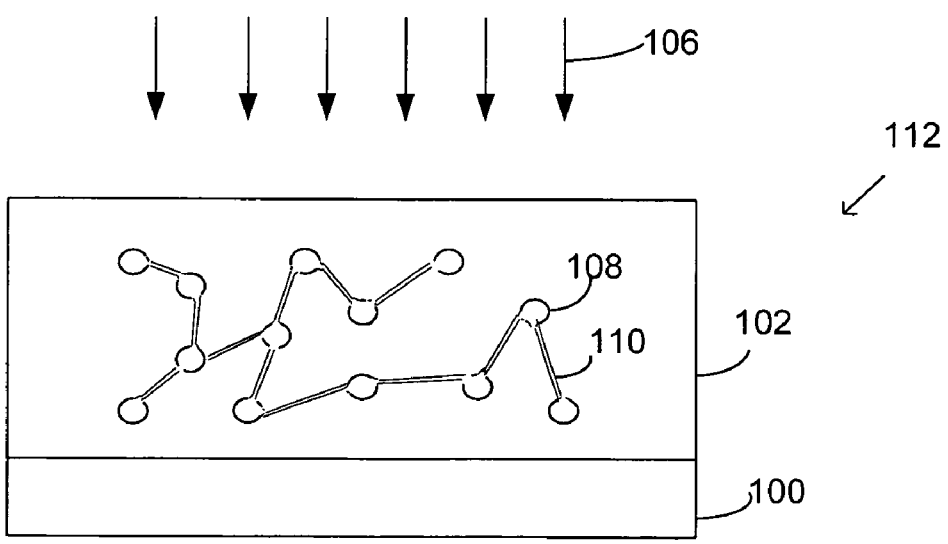

As the dielectric layer 102 and the porogen 104 are co-deposited, the porogen 104 may polymerize within the dielectric film 102 and may form a plurality of randomly dispersed, partially interconnected porogen 104 regions. In one embodiment, energy 106 may be applied to the dielectric layer 102, wherein the porogen 104 disposed within the dielectric layer 102 may decompose and/or volatize to form at least one pore 108, as is well known in the art (FIG. 1c). In one embodiment, the energy 106 applied to the dielectric layer 102 may comprise at least one of thermal energy, ultraviolate energy, plasma energy and electron beam energy. The type and amount of energy 106 applied to the dielectric layer 102 may vary according to the particular application, but the energy 106 applied to selectively decompose the porogen 104 may be such that it does not substantially decompose the dielectric layer 102, as is well known in the art.

Thus, by applying energy 106 to the porogen 104 disposed within the dielectric layer 102 to form the at least one pore 108, a porous dielectric layer 112 may be formed. In one embodiment, the porous dielectric layer 112 may comprise a porosity (i.e., the volume percentage of pores contained within the dielectric layer 102) of between about 10 to about 80 percent. In another embodiment, the amount of porosity may be varied depending upon the particular application. In one embodiment, the porous dielectric layer 112 may comprise a dielectric constant less than silicon dioxide. In one embodiment, the porous dielectric layer 112 may comprise a dielectric constant less than about 3.

Figure 1D:
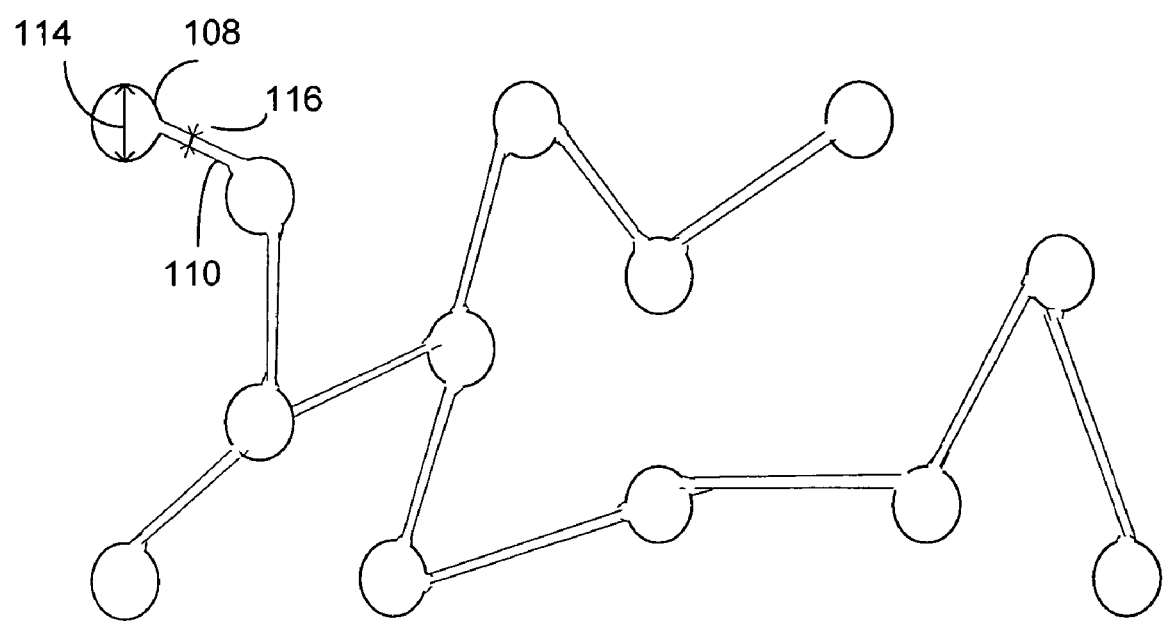

In one embodiment, individual pores of the at least one pore 108 may be connected to each other by at least one pore connector 110. The at least one pore connector 110 may comprise void regions within the porous dielectric layer 112 that may connect individual pores to each other. In one embodiment, a ratio of a diameter 114 of the at least one pore 108 to a diameter 116 of the at least one pore connector 110 may be greater than about 4:1 (FIG. 1d).

In one embodiment, the diameter 116 of the at least one pore connector 110 may be decreased by greatly reducing and/or substantially eliminating the oxidizing agent present in the plasma during the formation of the dielectric layer 102. For example, (for a given set of plasma deposition parameters) the ratio of the diameter 114 of the at least one pore 108 to the diameter 116 of the at least one pore connector 110 with a substantially zero oxidizing agent flow rate will be substantially greater than when an oxidizing agent flow rate of 100 scmm may be used.

Figure 2A:
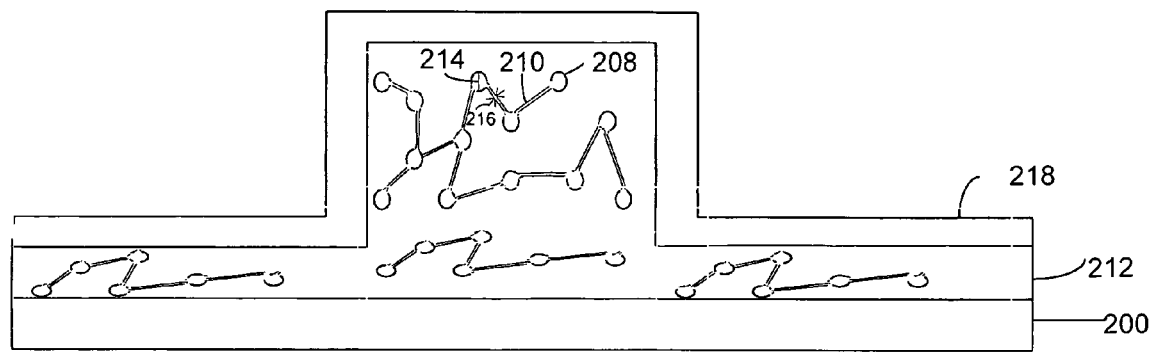
FIGS. 2a-2b represent methods of forming structures according to another embodiment of the present invention.
Figure 2B:
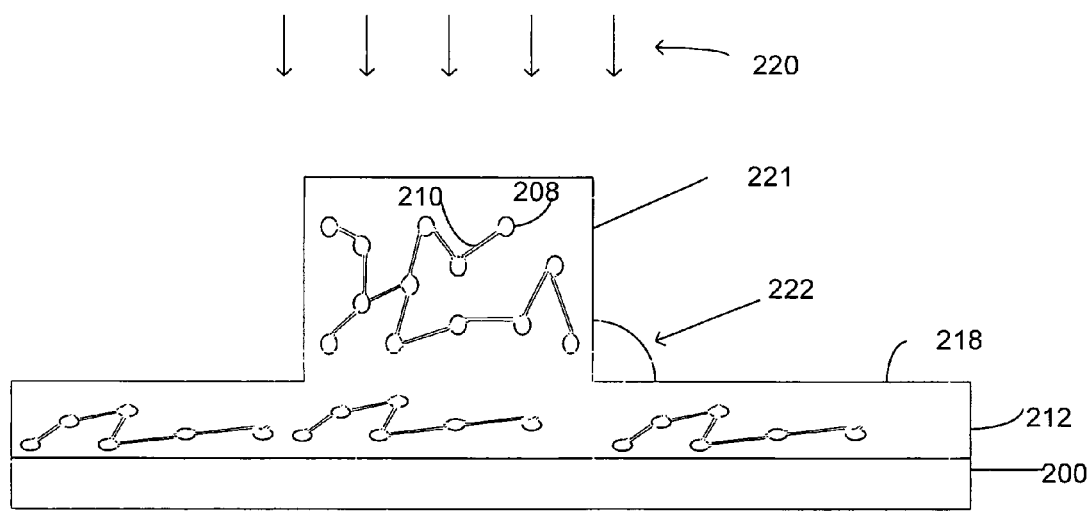

FIGS. 2a-2c depict another embodiment of the present invention. FIG. 2a illustrates a substrate 200, similar to the substrate 100 of FIG. 1a. In one embodiment, the substrate 200 may comprise any surface that may be generated when making a microelectronic device, upon which an insulating layer may be formed. A porous dielectric layer 212, similar to the porous dielectric layer 112 of FIG. 1c, may be disposed on the substrate 200. The porous dielectric layer 212 may comprise at least one pore 208. Individual pores of the at least one pore 208 may be connected to each other by at least one pore connector 210. In one embodiment, a ratio of a diameter 214 of the at least one pore 208 to a diameter 216 of the at least one pore connector 210 may be greater than about 4:1.

In one embodiment, the porous dielectric layer 212 may comprise a porosity of between about 10 to about 80 percent. The porous dielectric layer 212 may comprise a low k porous dielectric layer 212. In one embodiment, the porous dielectric layer 212 may comprise a dielectric constant of less than about 3.

In one embodiment, the porous dielectric layer 212 may comprise any organo-silane compound that may exhibit low etch rates in fluorinated etchant chemistries. The porous dielectric layer 212 may comprise in some embodiments a carbon to silicon ratio that is greater than about 2:1. In one embodiment the porous dielectric layer 211 may comprise an enhanced availability of terminal methyl groups, such as, for example, terminal methyl groups bonded to a silicon atom (Si—$CH_3$), and may comprise oxidizing groups incorporated within the organo-silane compound. In one embodiment, the porous dielectric layer 212 may comprise at least one of octamethyl-cyclotetrasiloxane and cyclo-pentamethylene-methyl-methoxy-silane.

A masking layer 218 may be disposed on the porous dielectric layer 212. In one embodiment, the masking layer 218 may serve to pattern the porous dielectric layer 212 according various photolithographic methods as are well known in the art. In one embodiment, the masking layer 218 may comprise a sacrificial light absorbing material that may include but is not limited to a spin-on-polymer (SOP) or spin-on-glass (SOG) combined with a dye, as are well known in the art. In another embodiment, the masking layer 218 may comprise a photoresist layer, as is well known in the art.

The masking layer 218 and the porous dielectric layer 212 may be exposed to a removal process 220 (FIG. 2b). The removal process 220 may comprise a wet etch in an etchant solution, for example and/or a dry etch process, as are well known in the art. In one embodiment, the removal process 220 may comprise a dilute aqueous solution of tetra-methyl ammonium hydroxide (TMAH). In another embodiment, the removal process may comprise an aqueous halogen containing species, such as a fluorine containing species, as are known in the art. In another embodiment, the removal process may comprise a halogen containing gaseous species, as are well known in the art.

In one embodiment, the porous dielectric layer 212, which may comprise a porosity of about 20-40 percent, and a dielectric constant of about 2.6 to about 2.2, may exhibit a removal rate of less than about 1 angstrom per minute in a dilute aqueous solution of TMAH, while the masking layer 218 may exhibit a removal rate of greater than about 500 angstroms per minute in the TMAH solution. Subsequent to the removal process 220, a sidewall angle 222 of a sidewall feature 221 of the porous dielectric layer 212 may comprise an angle relative to the substrate 200 between about 88 to about 90 degrees, i.e., the porous dielectric layer 212 may not comprise an appreciable amount of undercutting during the removal process, in one embodiment.

In one embodiment, because the ratio of carbon to silicon in the porous dielectric layer 212 may be greater than about 2:1, the stability of the porous dielectric layer 212 may be greatly enhanced during wet and/or dry removal processes. Additionally, because the porous dielectric layer 212 may be formed without an appreciable amount of oxidizing agent as described previously herein, the resultant increased resistance of the porous dielectric layer 212 to halogen attack can result in a significant decrease in critical dimension (CD) loss subsequent to wet clean and/or removal processes, in some embodiments.

Figure 3:
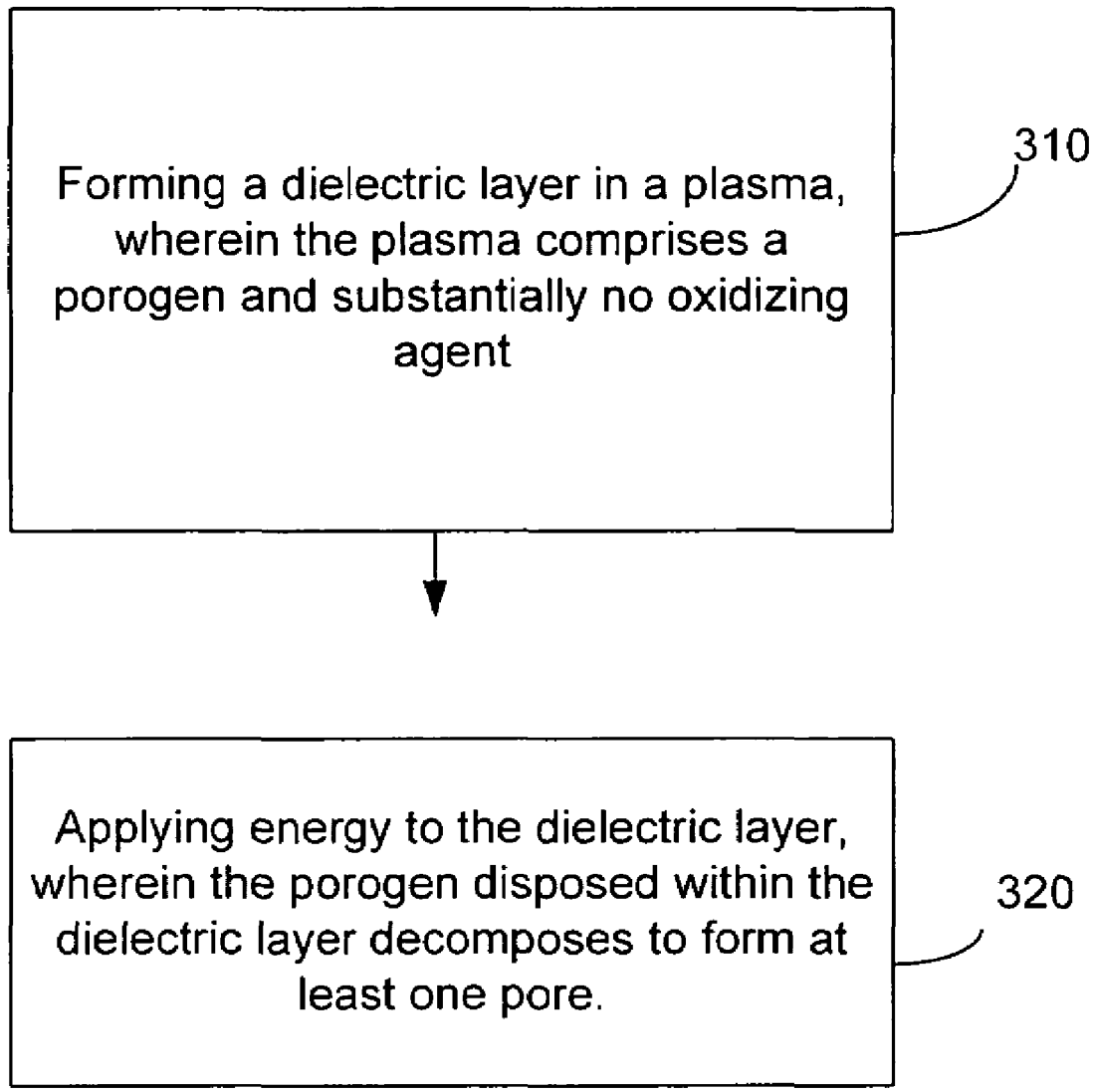
FIG. 3 represents a flowchart of another embodiment of the present invention.

FIG. 3 depicts a flowchart of another embodiment of the present invention. At step 310, a dielectric layer may be formed in a plasma, wherein the plasma may comprise a porogen and substantially no oxidizing agent. At step 320, an energy may be applied to the dielectric layer, wherein the porogen disposed within the dielectric layer may decompose to form at least one pore.

FIG. 4a depicts a structure 430, similar to the porous dielectric layer 112 of FIG. 1c, for example. In one embodiment, the porous dielectric layer 430 may comprise at least one pore 408, at least one pore connector 410, and may be disposed on a substrate 400, that may comprise a silicon substrate in one embodiment. A transistor structure 402, as is well known in the art, may be disposed on and/or adjacent/ contiguous with the porous dielectric layer 430. The transistor structure 402 may comprise a spacer 404, gate 406, a gate dielectric layer 408, and a source/drain structure 409, as are well known in the art. The substrate 400 may be disposed on a package substrate 401, that in one embodiment may comprise an interposer, for example, that may be coupled with a motherboard, such as a printed circuit board (PCB) (not shown) for example.

Figure 4B:
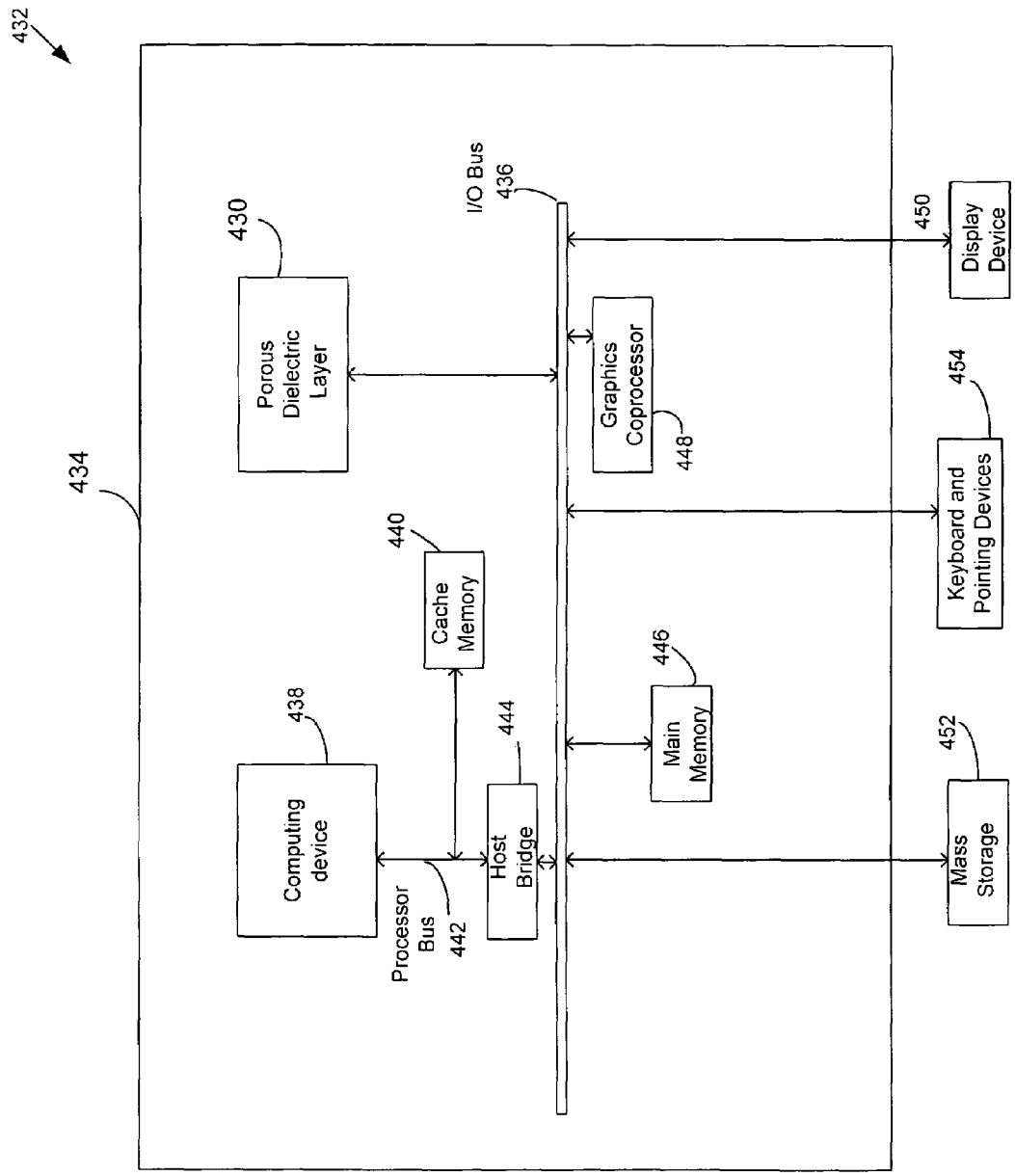

FIG. 4b is a diagram illustrating an exemplary system 432 capable of being operated with methods for fabricating a microelectronic structure, such as the porous dielectric layer 430 of FIG. 4a for example. It will be understood that the present embodiment is but one of many possible systems in which the substrate core structures of the present invention may be used.

In the system 432, the porous dielectric layer 430 may be communicatively coupled to a printed circuit board (PCB) 434 by way of an I/O bus 436. The communicative coupling of the porous dielectric layer 430 may be established by physical means, such as through the use of a package and/or a socket connection to mount the porous dielectric layer 430 to the PCB 434 (for example by the use of a chip package, interposer and/or a land grid array socket). The porous dielectric layer 430 may also be communicatively coupled to the PCB 434 through various wireless means (for example, without the use of a physical connection to the PCB), as are well known in the art.

The system 432 may include a computing device 438, such as a processor, and a cache memory 440 communicatively coupled to each other through a processor bus 442. The processor bus 442 and the I/O bus 436 may be bridged by a host bridge 444. Communicatively coupled to the I/O bus 436 and also to the porous dielectric layer 430 may be a main memory 446. Examples of the main memory 446 may include, but are not limited to, static random access memory (SRAM) and/or dynamic random access memory (DRAM), and/or some other state preserving mediums. The system 432 may also include a graphics coprocessor 348, however incorporation of the graphics coprocessor 448 into the system 432 is not necessary to the operation of the system 432. Coupled to the I/O bus 436 may also, for example, be a display device 350, a mass storage device 452, and keyboard and pointing devices 454.

These elements perform their conventional functions well known in the art. In particular, mass storage 452 may be used to provide long-term storage for the executable instructions for a method for forming substrate core structures in accordance with embodiments of the present invention, whereas main memory 446 may be used to store on a shorter term basis the executable instructions of a method for a forming porous dielectric layer in accordance with embodiments of the present invention during execution by computing device 438. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 446 may supply the computing device 438 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as a porous dielectric layer, are well known in the art. Therefore, the Figures provided herein illustrate only portions of an exemplary microelectronic structure that pertains to the practice of the present invention. Thus the present invention is not limited to the structures described herein.

What is claimed is:

1. A structure comprising:
   a porous dielectric layer, wherein the porous dielectric layer comprises a silicon carbon hydroxyl material wherein the ratio of carbon to silicon is greater than about 2:1, and wherein the ratio between a diameter of at least one pore disposed within the porous dielectric layer and a diameter of at least one pore connector is greater than about 4:1.

2. The structure of claim 1 wherein the porous dielectric layer comprise at least one of octamethyl-cyclotetrasiloxane and cyclo-pentamethylene-methyl-methoxy-silane.

3. The structure of claim 1 wherein the porous dielectric layer comprises a dielectric constant less than about 3.

4. The structure of claim 1 wherein the porous dielectric layer comprises at least one terminal silicon methyl group.

5. The structure of claim 1 wherein the porous dielectric layer comprises a porosity of between about 10 to about 80 percent.

6. The structure of claim 1 wherein the porous dielectric layer comprises a removal rate of less than about 1 angstroms per minute in at least one of an aqueous solution of TMAH.

7. The structure of claim 1 wherein the porous dielectric layer comprises a removal rate of less than about 1 angstroms per minute in a fluorine containing etchant.

* * * * *